United States Patent [19]

Steinhage

[11] 4,342,941

[45] Aug. 3, 1982

[54] THERMAL IMAGE EXPOSURE PLATE

[75] Inventor: Peter W. Steinhage, Wiesbaden, Fed. Rep. of Germany

[73] Assignee: Heimann GmbH, Wiesbaden, Fed. Rep. of Germany

[21] Appl. No.: 142,704

[22] Filed: Apr. 22, 1980

[30] Foreign Application Priority Data

May 30, 1979 [DE] Fed. Rep. of Germany ....... 2922048

[51] Int. Cl.³ .............................................. H01J 31/00
[52] U.S. Cl. .................................... 313/374; 250/333; 313/388
[58] Field of Search ............... 313/388, 101, 367, 374; 250/333; 358/113

[56] References Cited

U.S. PATENT DOCUMENTS

| | | | |
|---|---|---|---|
| 3,774,043 | 11/1973 | LeCarvennec | 250/333 X |
| 3,928,768 | 12/1975 | Crowell | 250/333 |
| 4,097,742 | 6/1978 | Eberhardt | 250/333 |
| 4,180,759 | 12/1979 | Harris et al. | 313/388 |
| 4,225,882 | 9/1980 | Moriroud et al. | 250/333 X |

FOREIGN PATENT DOCUMENTS 1395741  5/1975  United Kingdom .

Primary Examiner—Davis L. Willis
Attorney, Agent, or Firm—Hill, Van Santen, Steadman, Chiara & Simpson

[57] ABSTRACT

A thermal image exposure plate is disclosed having a grid pattern on one side thereof exposed to thermal radiation. The grid pattern depth is less than a thickness of the plate. High image resolution and image sensitivity results. The plate is useful in thermal image exposure devices, particularly in a pyroelectric picture tube.

8 Claims, 2 Drawing Figures

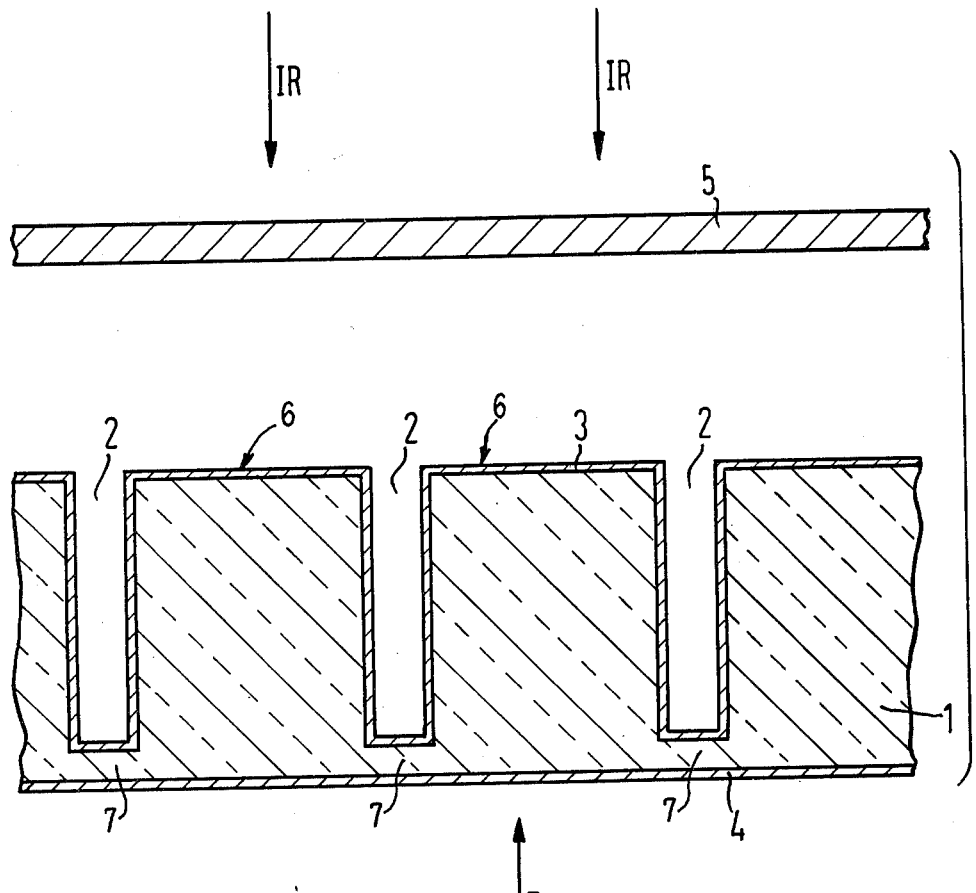
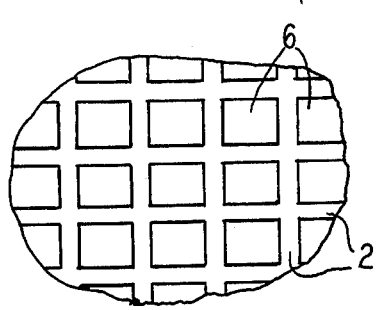

THERMAL IMAGE EXPOSURE PLATE

BACKGROUND OF THE INVENTION

The invention relates to a thermal image exposure plate which, via a physical transfer or conversion effect from the thermal radiation corresponding to a thermal image and incident with topical distribution pattern, generates a corresponding image of a topically distributed property such as, for example, a charge image via a pyroelectric effect, i.e., an image with topically distributed electrical charge. A conversion layer is provided which is designed with a grid formation by means of interruptions in the material. This prevents lateral heat conduction and the lack of image definition connected therewith.

In the most general sense, such a thermal image exposure plate serves as the receiver of a thermal image which is imaged onto the plate via an optical device and generates there a corresponding topically distributed temperature relief pattern due to absorption and heating. As an essential component, the thermal image exposure plate has a conversion or transfer layer as the carrier of the temperature relief pattern, said conversion layer converting or translating the temperature relief into a relief of utilizable properties. Depending upon the material employed, that can be a topically distributed charge relief pattern via the pyroelectric effect, but can also be a voltage relief pattern relative to a basic electrode via a thermal electric effect, or an image of topically distributed electric resistance via a thermal-resistive effect. Electrical values are not the only thing conceivable as the image content. Other designs are also possible, for example, a topical distribution pattern of the optical index of refraction generated by the thermal radiation. One may select the suitable effect depending on the usefulness favorable for the respective employment.

Apart from a pure conversion of the thermal image into an image visible to the naked eye, the most common use of the image generated is to scan it via a concentrated electron beam in a camera tube which generates from the image an electrical signal correspondingly occurring in timed fashion. This is either stored or displayed as a visible image via a picture tube.

The building-up of the temperature relief pattern due to the thermal radiation imaged on the thermal image exposure plate ensues according to an exponential function. On the one hand, sufficient time must be given so that the temperature relief can build up in the transfer layer, rendering possible a sufficient intensity of the image generated by the transfer layer. On the other hand, the image sharpness is determined by the lateral thermal conductivity of the transfer layer or, respectively, of the applied layers also present. The topical temperature differences built up, in accordance with the lateral thermal conductivity, have the tendency to flow into one another and, thus reduce the image sharpness.

For that reason, the incident thermal radiation is generally chopped, i.e., the thermal image is periodically faded in and out via a modulating diaphragm and, by so doing, the temperature relief is repeatedly re-built-up with the modulation frequency. Thereby, the optical resolution increases with the modulation frequency, but the sensitivity decreases due to the thermal retention time thereby becoming smaller.

In order to obtain the longest possible thermal retention time and, thus high signal sensitivity given high image resolution at the same time with low modulation frequencies or also, for example, given slow panning of the thermal image exposure device over the scene of the exposure, it is known and described, for example, in German OS No. 22 23 288 corresponding to British Pat. No. 1,395,741, to arrange the pyroelectric transfer or conversion layer of a pyroelectric camera tube in a grid. The transfer or conversion layer then consists of a mosaic of pyroelectric elements which are secured separated from one another to a carrier with low lateral thermal conductivity. By so doing, the cross-talk of the individual image points due to lateral thermal conduction is reduced. The carrier side not in a grid pattern is provided with an electrode layer permeable to thermal radiation and faces the thermal radiation side. The grid side of the transfer layer which remains open faces the scanning electron beam. For reasons of thermal conduction, the channels separating the individual mosaic points must have sufficient width, but can add nothing to the signal generation with the surface they take up. Since the lattice constant of the grid should be as small as possible in order to achieve a high image resolution, i.e., the mosaic should be as fine as possible, the ratio of the active transfer layer surface to the passive channel surface is unfavorable for a good signal sensitivity. Further, providing a carrier layer with poor lateral thermal conductivity produces a layer with relatively high thermal capacity, which likewise weakens the signal sensitivity.

SUMMARY OF THE INVENTION

In view of this state of the art, an object of the present invention is to specify a better structure for a thermal image exposure plate which renders possible a high image resolution in general use and at the same time not have any weakening of sensitivity.

The following features are inventively proposed for achieving this object in a thermal image exposure plate of the invention:

(a) The grid faces the incident thermal radiation; and
(b) The grid does not extend through the entire thickness of the conversion or transfer layer, so that a heat-conducting through or transfer portion of the conversion layer is formed thereat in the direction of radiation.

The grid facing the thermal radiation allows the cut channels to be made so narrow that only the lateral heat conduction is interrupted. By so doing, the build-up of a high-resolution temperature profile with high sensitivity is possible. That in turn, however, allows the channels to be made only as deep as necessary. After the time-wise build-up of the temperature profile up to the bottom of the channels and after sufficient time to evaluate the transfer effect, the temperature profile can again flow off via the through-portion of the transfer layer.

In particular, it is advantageous to use a thermal image exposure plate in the following ways:

(c) It is employed in conjunction with a diaphragm having a dark period and light period which chops the thermal image in time-wise fashion;
(d) The depth of the channels forming the grid in the transfer layer as well as the thickness of the through or transfer portion of the transfer layer beneath the channels are dimensioned in such manner that the influence of the thermal radiation on the grid points during the light period has penetrated up to the through-portion of the transfer layer and that the topical distribution pattern of the thermal influence equalizes in the through-portion of the transfer layer during the dark period.

For example, given electron beam scanning, the converted thermal image is scanned at that point in time when the temperature relief pattern has been built up to the bottom of the channels. Subsequently, in the dark period of the modulating diaphragm, the image bleeds in the through-portion of the transfer layer which is laterally heat-conductive, so that at the beginning of the next light period, the preceding temperature relief pattern has been largely equalized.

The more completely the temperature equalization in the dark period ensues, the lower the thermal inertia of the image. In an advantageous embodiment, it is therefore provided that the side of the transfer layer without the grid is covered with an electrical insulating layer of high thermal conductivity.

The inventive thermal image exposure plate is preferably employed as the target in a camera tube for thermal images and consists of pyroelectric, thermal-resistive, or thermal-electric material.

BRIEF DESCRIPTION OF THE DRAWINGS

FIG. 1A illustrates in cross-section a sample embodiment employing the thermal image exposure plate of the invention in a pyroelectric camera tube whose details, however, have been omitted for the sake of simplicity; and FIG. 1B illustrates a portion of a face of the image plate from direction IR in FIG. 1A showing individual picture elements.

DESCRIPTION OF THE PREFERRED EMBODIMENTS

In FIG. 1A, 1 indicates a pyroelectric transfer or conversion layer consisting of triglycinsulfate which serves as a target in a picture tube (not illustrated) and a cross-section along the tube axis. The grid pattern composed of a series of rectangular picture elements 6 when viewed from above in FIG. 1B is partially visible at cut channels 2 which extend from the side facing the thermal radiation side—referenced with "IR"—into the interior of the transfer layer 1 and leave a narrow, through-portion 7 of the transfer layer 1 unslotted or uncut below each cut channel. This faces the scanning side—referenced with "E". A coherent, electrically conductive signal electrode 3, permeable by the thermal radiation, and consisting for example of chromium-nickel or titanium, extends over the entire surface of the transfer or conversion layer 1 facing the thermal radiation including the channel walls and bottoms. The side facing the scanning electron beam is covered with a continuous, heat-conducting and electrically insulating layer 4 consisting of aluminum oxide. A modulating diaphragm well known in this art which alternatively and periodically generates a light period and a dark period is referenced 5 and is placed in front of the transfer layer 1 on the thermal radiation side.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A thermal image exposure plate system, comprising:
   conversion layer means for producing a topically distributed pattern of a given property as a result of and which corresponds to a thermal image incident on the layer means; and
   said conversion layer means having a surface facing the incident thermal image formed into a grid pattern of a plurality of picture elements, each picture element being defined by a cut channel extending from the surface facing the image to a depth less than a thickness of the layer means so that a heat-conducting through-portion of the layer means is formed between adjacent picture elements and between the radiation side and an opposite scanning side of the layer means accessible for scanning by an electron beam.

2. The system of claim 1 wherein the given property comprises a charge image generated by the layer means via a pyroelectric effect and the layer means comprises a pyroelectric material.

3. The thermal image exposure plate system according to claim 1 wherein diaphragm means through which the thermal radiation passes provides alternate dark and light periods which chops the thermal image in timewise fashion; and the depth of the channels forming the grid pattern in the conversion layer means as well as a thickness of the through-portion of the conversion layer means are dimensioned such that an influence of the thermal radiation on the grid picture elements during the light period has penetrated to the through-portion of the layer means and that the topically distributed pattern induced by the thermal image equalizes in the through-portion during the dark period.

4. A thermal image exposure plate system according to claim 1, wherein the scanning side of the conversion layer means without the grid pattern is covered with an electrically insulating layer of high thermal conductivity.

5. A thermal image exposure plate system according to claim 1 wherein the layer means is employed as a target in a picture tube for thermal images and the side without the grid pattern is scanned by an electron beam.

6. A thermal image exposure plate system according to claim 1 wherein the layer means comprises thermal-resistive material and is employed as a target in a picture tube for thermal images.

7. A thermal image exposure plate system according to claim 1 wherein the layer means comprises thermal-electric material and is employed as the target in a picture tube for thermal images.

8. A thermal image exposure plate system, comprising:
   conversion layer means for producing a topically distributed charge image pattern as a result of a pyroelectric effect, said charge image pattern corresponding to a thermal image incident on one side of the layer means;
   said one side of the conversion layer means having a grid pattern of a plurality of picture elements, each picture element defined by a cut channel extending from the surface facing the image to a depth less than a thickness of the layer means so as to create a through-portion of the layer means;
   a thermally permeable signal electrode over the grid pattern on the side facing the thermal image; and
   an opposite side of the layer means being accessible for scanning by an electron beam and having an electrical insulating layer thereon.

* * * * *